United States Patent [19]
Mudd

[11] Patent Number: 5,734,273
[45] Date of Patent: Mar. 31, 1998

[54] PHASE LOCK DETECTOR

[75] Inventor: Mark Stephen John Mudd, Swindon, United Kingdom

[73] Assignee: Plessey Semiconductors Limited, United Kingdom

[21] Appl. No.: 404,511

[22] Filed: Mar. 15, 1995

[30] Foreign Application Priority Data

Mar. 18, 1994 [GB] United Kingdom ............... 9405365

[51] Int. Cl.$^6$ ............................................. H03L 7/06
[52] U.S. Cl. .................. 327/36; 327/159; 331/DIG. 2
[58] Field of Search ................................ 327/2, 3, 7, 41, 327/23, 12, 31, 36, 147, 156; 331/1 R, 25, DIG. 2

[56] References Cited

U.S. PATENT DOCUMENTS

| | | | |
|---|---|---|---|
| 3,988,696 | 10/1976 | Sharpe | 331/1 A |
| 3,996,481 | 12/1976 | Chu et al. | 307/262 |
| 4,290,029 | 9/1981 | Streckenbach | 331/1 A |
| 5,180,933 | 1/1993 | Krzyzanowski | 307/514 |

FOREIGN PATENT DOCUMENTS

| | | |
|---|---|---|
| 0 012 899 A1 | 12/1978 | European Pat. Off. . |
| 0 550 360 A1 | 7/1993 | European Pat. Off. . |
| 2 197 554 | 5/1988 | United Kingdom . |

*Primary Examiner*—Timothy P. Callahan
*Assistant Examiner*—Jeffrey Zweizig
*Attorney, Agent, or Firm*—Kirschstein, et al.

[57] ABSTRACT

A phase lock detector for a digital phase locked loop frequency synthesiser in which phase errors, represented by phase error pulses of a duration equal to the relative time displacement of synthesised and reference waveforms in the phase locked loop, are compared with a predetermined time interval representing the maximum phase error acceptable in a phase-lock condition. A favourable result of the comparison may be required to persist for a predetermined time before a phase-lock indication is given, to avoid jitter or flicker of that indication in a near-lock situation.

6 Claims, 1 Drawing Sheet

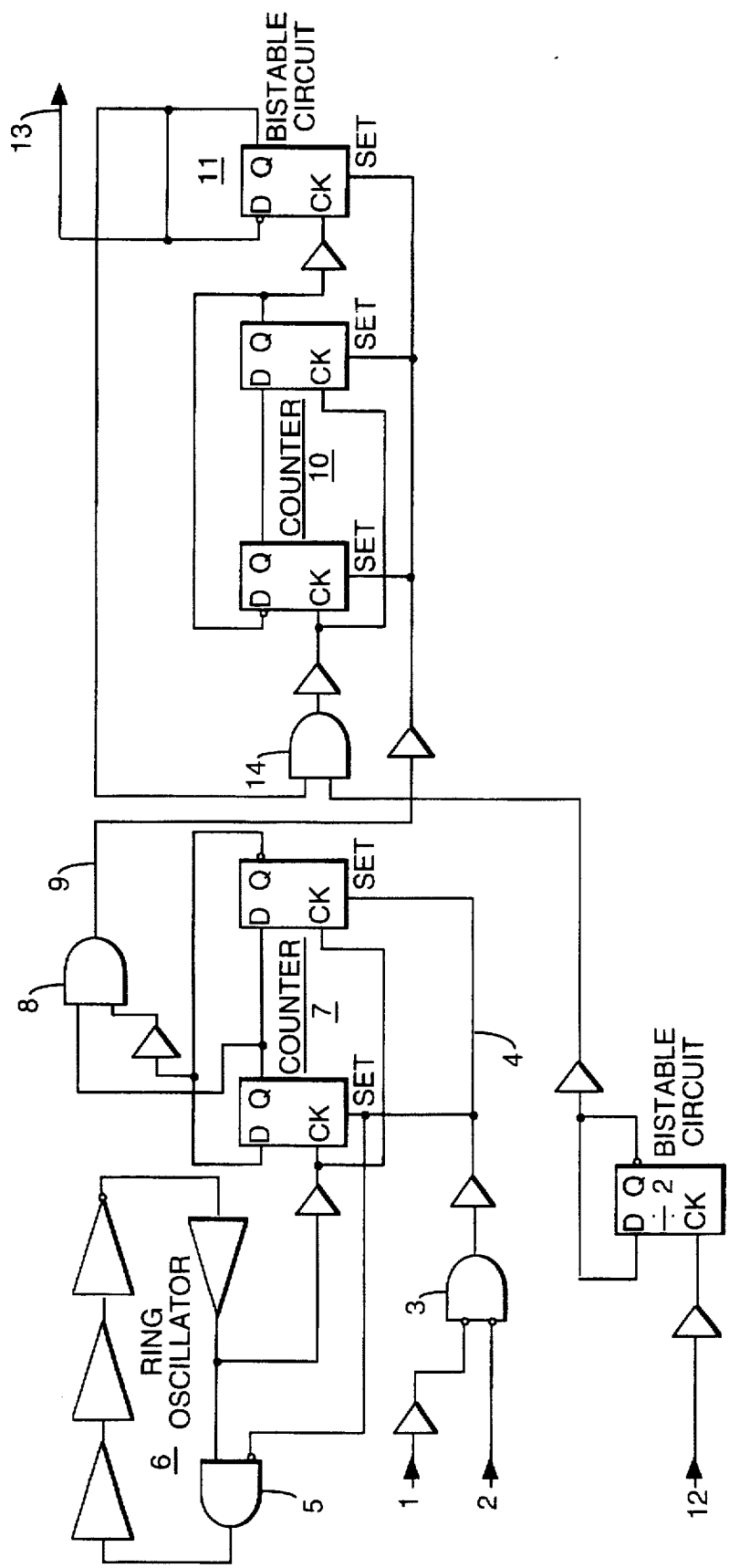

PHASE LOCK DETECTOR

BACKGROUND OF THE INVENTION

The present invention relates to a phase lock detector for a digital phase locked loop frequency synthesiser.

Often in phase locked loop arrangements it is necessary to provide a signal indicating whether "lock" has in fact been achieved, this signal being made available, say, on an output terminal of the arrangement or as a specified bit in a serial data word clocked from the arrangement. In either case some means for generating this signal is required.

Determination of whether lock has been achieved may be based on an assessment of whether the phase error indicated by the phase detector of the phase locked loop is sufficiently small, by comparing a time interval representing the phase error with a predetermined time interval, "in lock" being indicated when the phase error interval is shorter than the predetermined time interval. A first problem with this approach is that the required predetermined time interval is much shorter than any reference interval normally available. For example, in a typical phase locked loop arrangement for television tuner applications, the interval required may be of the order of 100 ns, while the highest reference frequency available may be 4 MHz, defining a 250 ns period.

A second problem is how to maintain stability of the lock signal produced, so that when the phase locked loop arrangement is close to lock, the "in lock" signal does not flicker on and off.

SUMMARY OF THE INVENTION

According to one aspect of the present invention a phase lock detector arrangement for a digital phase locked loop frequency synthesiser comprises an oscillator and counter means for defining a predetermined interval, and means for comparing said predetermined time interval with a phase error interval between corresponding events in a synthesised waveform and a reference waveform to detect phase lock.

According to another aspect of the present invention a phase lock detector arrangement for a digital phase locked loop frequency synthesizer in which a phase error is characterisable as a time interval between an event in a synthesised waveform and a corresponding event in a reference waveform, and phase lock is taken to be established if said phase error time interval is less than a predetermined value, comprises an oscillator responsive to the occurrence of said event in one of said synthesised and reference waveforms to commence oscillating, counter means to count output cycles of said oscillator, and means responsive to a predetermined count state of said counter means to give a large-error indication if said phase error time interval is greater than said predetermined value.

Preferably the occurrence of said event in the other of said synthesised and reference waveforms is arranged to stop the oscillator and to reset the counter means. The absence of said large-error indication for more than a predetermined time may be taken to indicate phase lock. A second counter means may be provided to determine said predetermined time, said second counter means being arranged to be reset upon the occurrence of said large-error indication.

BRIEF DESCRIPTION OF THE DRAWING

A phase lock detector for a digital phase locked loop frequency synthesiser will now be described by way of example with reference to the accompanying drawing, which shows the detector schematically.

DETAILED DESCRIPTION OF THE PREFERRED EMBODIMENT

Referring to the drawing, phase error signals between synthesised and reference waveforms from a phase locked loop frequency synthesiser (not shown), which waveforms may be effectively of two-state form, at inputs 1 and 2 are applied inverted to an And gate 3 to derive a single phase error pulse signal on path 4 which commences when one of the waveforms changes state in a given sense and terminates when the other waveform changes state in the same sense. The phase error pulse signal is applied to an input of an And gate 5 forming part of a ring oscillator 6 and to the "set" inputs of a two-bit counter 7. In the absence of a phase error pulse the ring counter 6 is disabled and the counter 7 is held in a predetermined state, such as 1,1.

At the commencement of a phase error pulse the ring oscillator is enabled, its period being, say, 60 ns, and the counter 7 is released to begin counting output cycles of the oscillator 6. If the phase error pulse if longer than 180 ns, that is, three cycles of the oscillator 6, so that the count state of the counter reaches 1,0, an And gate 8 provides a large-error output on path 9. If, however, the phase error pulse is shorter than 180 ns the oscillator 6 is disabled, the counter 7 is set again, and no output is provided on path 9, this condition, if persisting, indicating the required phase-lock state.

The path 9 is connected to the "set" inputs of a two-bit counter 10 and a bistable circuit 11, setting them or holding them in their respective reset states whenever a large-error output signal is provided by the And gate 8. When the large-error signal on the path 9 ceases the counter 10 and the bistable circuit 11 are enabled, and the counter 10 starts to count signals at half the frequency of a reference signal applied to an input 12. After four periods of this half reference frequency, which may define an interval of the order of a millisecond, the bistable circuit 11 is switched to its "reset" state (logic 'O') and an indication is given on an output path 13 that phase lock has been achieved. At the same time the counter 10 is disabled by way of an And gate 14, so that the phase lock indication is maintained until a large-error signal occurs again on path 9.

If a large-error is detected before the count state of the counter 10 has reset the bistable circuit 11, the counter 10 and bistable circuit 11 will be set again, forcing the count to start again. The phase lock indication on output 13 will therefore be given only if an interval of four or more periods of the half reference frequency, i.e. one millisecond or more, occurs without large error signals on the path 9, to avoid any litter or flicker that may occur when close to lock.

The period of the oscillator 6 may be adjusted by varying either the power or the number of the buffer stages in the ring.

I claim:

1. A phase lock detector arrangement for a digital phase locked loop frequency synthesizer in which phase error is measurable as a time interval between an event in a synthesized waveform and a corresponding event in a reference waveform, and in which phase lock is taken to be indicated by a phase error time interval of less than a predetermined value, the detector arrangement comprising: an oscillator having output cycles; counter means; means responsive to the occurrence of said event in one of said synthesized and reference waveforms to start said oscillator and to the occurrence of said event in the other of said synthesized and reference waveforms to stop said oscillator; said counter means being arranged to count the output cycles of said oscillator; and means responsive to a predetermined count state of said counter means to give a large-error indication.

2. The phase lock detector arrangement in accordance with claim 1, wherein the occurrence of said event in the other of said synthesized and reference waveforms is arranged to reset the counter means.

3. The phase lock detector arrangement in accordance with claim 1, wherein the absence of said large-error indication for more than a predetermined time is taken to indicate phase-lock; and further comprising a second counter means which is arranged to determine said predetermined time and which is arranged to be reset upon the occurrence of said large-error indication.

4. The phase lock detector arrangement in accordance with claim 2, wherein the absence of said large-error indication for more than a predetermined time is taken to indicate phase-lock; and further comprising a second counter means which is arranged to determine said predetermined time and which is arranged to be reset upon the occurrence of said large-error indication.

5. The phase lock detector arrangement in accordance with claim 1, wherein the oscillator is a ring oscillator.

6. A phase lock detector arrangement for a digital phase locked loop frequency synthesizer in which phase error is measurable as a time interval between an event in a synthesized waveform and a corresponding event in a reference waveform, and in which phase lock is taken to be indicated by a phase error time interval of less than a predetermined value, the detector arrangement comprising: a ring oscillator having output cycles; counter means; means responsive to the occurrence of said event in one of said synthesized and reference waveforms to start said oscillator and to the occurrence of said event in the other of said synthesized and reference waveforms to stop said oscillator and to reset said counter means; said counter means being arranged to count the output cycles of said oscillator; and means responsive to a predetermined count state of said counter means to give a large-error indication.

* * * * *